(12) United States Patent
Choi

(10) Patent No.: US 11,908,766 B2
(45) Date of Patent: Feb. 20, 2024

(54) COOLING SYSTEM WHERE SEMICONDUCTOR COMPONENT COMPRISING SEMICONDUCTOR CHIP AND COOLING APPARATUS ARE JOINED

(71) Applicant: JMJ Korea Co., Ltd., Bucheon-si (KR)

(72) Inventor: Yun Hwa Choi, Bucheon-si (KR)

(73) Assignee: JMJ Korea Co., Ltd., Busan (KR)

( * ) Notice: Subject to any disclaimer, the term of this patent is extended or adjusted under 35 U.S.C. 154(b) by 296 days.

(21) Appl. No.: 17/486,926

(22) Filed: Sep. 28, 2021

(65) Prior Publication Data

US 2022/0319946 A1 Oct. 6, 2022

(30) Foreign Application Priority Data

Apr. 5, 2021 (KR) .................. 10-2021-0044053
Jun. 11, 2021 (KR) .................. 10-2021-0076086

(51) Int. Cl.
*H01L 23/367* (2006.01)
*H01L 23/473* (2006.01)

(52) U.S. Cl.
CPC .......... *H01L 23/367* (2013.01); *H01L 23/473* (2013.01)

(58) Field of Classification Search
CPC ............ H01L 23/367–3677; H01L 23/46–473
See application file for complete search history.

(56) References Cited

U.S. PATENT DOCUMENTS

| | | | |
|---|---|---|---|
| 2013/0285234 A1 | 10/2013 | Uhlemann et al. | |
| 2014/0035119 A1* | 2/2014 | Permuy | H01L 23/051 |
| | | | 257/690 |
| 2014/0321063 A1 | 10/2014 | Uhlemann et al. | |
| 2014/0367842 A1 | 12/2014 | Miyamoto et al. | |
| 2016/0079155 A1 | 3/2016 | Kawase et al. | |
| 2018/0082925 A1 | 3/2018 | Grassmann et al. | |
| 2020/0350232 A1 | 11/2020 | Gradinger et al. | |
| 2020/0388557 A1* | 12/2020 | Yoo | H01L 23/3735 |

FOREIGN PATENT DOCUMENTS

| | | |
|---|---|---|
| CN | 1109258 A | 9/1995 |
| EP | 3703117 A1 | 9/2020 |
| JP | H02-020049 A | 1/1990 |
| JP | 2002-158322 A | 5/2002 |
| JP | 2020-136648 A | 8/2020 |
| KR | 10-2001-0045141 A | 6/2001 |
| KR | 10-2011-0115304 A | 10/2011 |
| KR | 10-1472642 B1 | 12/2014 |
| KR | 10-2017-0069365 A | 6/2017 |
| KR | 10-1899788 B1 | 11/2018 |
| KR | 10-1920915 B1 | 11/2018 |
| KR | 10-2019-0133156 A | 12/2019 |
| KR | 10-2020-0142951 A | 12/2020 |
| KR | 10-2411122 B1 | 6/2022 |
| WO | 2020/174584 A1 | 9/2020 |

\* cited by examiner

*Primary Examiner* — Tucker J Wright
(74) *Attorney, Agent, or Firm* — Park, Kim & Suh, LLC

(57) ABSTRACT

The present invention relates to a cooling system where a semiconductor component including a semiconductor chip and a cooling apparatus are joined, wherein a coolant is supplied to a substrate, on which a semiconductor chip is installed, through an opening member of the cooling apparatus so that a surface of the substrate may be directly cooled by the coolant so as to improve cooling efficiency, and a cooling post structure, which enables the coolant to smoothly flow, is used to further improve cooling efficiency.

20 Claims, 11 Drawing Sheets

COOLING SYSTEM WHERE SEMICONDUCTOR COMPONENT COMPRISING SEMICONDUCTOR CHIP AND COOLING APPARATUS ARE JOINED

CROSS-REFERENCE TO RELATED PATENT APPLICATION

This application claims the benefit of Korean Patent Application Nos. 10-2021-0044053, filed on Apr. 5, 2021, 10-2021-0076086 filed on Jun. 11, 2021, in the Korean Intellectual Property Office, the disclosure of which is incorporated herein in its entirety by reference.

BACKGROUND OF THE INVENTION

Field of the Invention

The present invention relates to a cooling system where a semiconductor component including a semiconductor chip and a cooling apparatus are joined, wherein a coolant is supplied to a substrate, on which a semiconductor chip is installed, through an opening member of the cooling apparatus so that a surface of the substrate may be directly cooled by the coolant so as to improve cooling efficiency, and a cooling post structure, which enables the coolant to smoothly flow, is used to further improve cooling efficiency.

Description of the Related Art

As well known in the art, electrical and electronic components, especially semiconductor components generate heat while being operated so that a heat sink or a cooling system is needed to prevent overheating so as to maintain their performances.

Particularly, overheating generated from semiconductor components applied to a high-power application field is prevented by a cooling system where a coolant circulates.

In a cooling system, a cooling part member for contacting a circulating coolant is inserted to cool down heat transmitted to the cooling part member from the semiconductor component. In general, the cooling part member is formed as one body with an upper substrate or a lower substrate included in the cooling system by using a processing or a casting production process and thus, mostly has a linear structure.

However, an indirect cooling method using the cooling part member having a simple linear structure has a limit to maximize efficiency of heat conductivity or heat radiation. In this regard, the cooling part members having various structures need to be applied and a direct cooling method using a coolant is needed to improve efficiency of heat conductivity and heat radiation.

SUMMARY OF THE INVENTION

The present invention provides a cooling system where a semiconductor component including a semiconductor chip and a cooling apparatus are joined, wherein a coolant is supplied to a substrate, on which a semiconductor chip is installed, through an opening member of the cooling apparatus so that a surface of the substrate is directly cooled by the coolant so as to improve cooling efficiency, and a cooling post structure, which enables the coolant to smoothly flow, is used to further improve cooling efficiency.

According to an aspect of the present invention, there is provided a cooling system where a semiconductor component including a semiconductor chip and a cooling apparatus are joined, the system including: semiconductor components including at least one substrate, where at least one semiconductor chip is installed on one side thereof, a package housing covering the substrates, and at least one terminal lead electrically connected to the semiconductor chips and exposed to the outside of the package housing, wherein the other sides of the substrates are partly or entirely exposed to the upper surface, the lower surface, or the upper and lower surfaces of the package housing; and a cooling apparatus including a cover body and at least one cooling post, wherein the cover body comprises a coolant flow path in an inner space thereof and at least one opening member on one side thereof where the substrate contacts, and the at least one cooling post is arranged vertically across the inner space of the cover body and is formed of a conductive or non-conductive material, wherein the cooling apparatus further includes at least one inlet, where a coolant flows in, and at least one outlet, from where a coolant is discharged, areas of the upper surfaces or the lower surfaces of the semiconductor components are larger than areas of the opening members and at least one length of the substrates exposed to the surface of the package housing is shorter than at least one length of the opening members, and heat generated and transmitted from the semiconductor chip to the substrates, which are exposed through the opening members, and the cooling posts is directly cooled by a coolant.

According to another aspect of the present invention, there is provided a cooling system where a semiconductor component including a semiconductor chip and a cooling apparatus are joined, the system including: semiconductor components including at least one substrate, where at least one semiconductor chip is installed on one side thereof, a package housing covering the substrates, and at least one terminal lead electrically connected to the semiconductor chips and exposed to the outside of the package housing, wherein the other sides of the substrates are partly or entirely exposed to the upper surface, the lower surface, or the upper and lower surfaces of the package housing; and a cooling apparatus including a cover body and at least one cooling post, wherein the cover body comprises a coolant flow path in an inner space thereof and at least one opening member on one side thereof where the substrate contacts, and the at least one cooling post is arranged vertically across the inner space of the cover body and is formed of a conductive or non-conductive material, wherein the cooling apparatus further includes at least one inlet, where a coolant flows in, and at least one outlet, from where a coolant is discharged, areas of the upper surfaces or the lower surfaces of the semiconductor components are larger than areas of the opening members and at least one length of the substrates exposed to the surface of the package housing is longer than at least one length of the opening members, and heat generated and transmitted from the semiconductor chip to the substrates, which are exposed through the opening members, and the cooling posts is directly cooled by a coolant.

The cooling posts may be plural in number, and distances at one ends between the adjacent cooling posts and distances at the other ends between the adjacent cooling posts may be different from each other.

The at least one terminal lead included in the package housing may be joined to one surface of the substrate and the joined terminal leads and the cover body of the cooling apparatus may face each other in a horizontal direction.

The package housing of the semiconductor components or the other side of the substrate may be joined to the cover body of the cooling apparatus by using a conductive adhesive or a non-conductive adhesive.

The cooling posts may be projected from the other side of the substrate.

The cooling posts may be formed of a material that is same as that of the other side of the substrate.

The cooling posts may be formed of a material that is different from that of the other side of the substrate.

The cooling posts may be formed of a single material including Cu or Al or an alloy containing 50% or more of Cu or Al.

The cooling posts may be formed of a ceramic material.

The cooling posts may be formed in a spring structure having an elastic force.

The cooling posts may be joined to the other side of the substrate by using a conductive adhesive or a non-conductive adhesive.

The length of the cooling posts after the semiconductor components are joined to the cooling apparatus may be formed to be shorter than the length of the cooling posts before the semiconductor components are joined to the cooling apparatus.

The lower surfaces of the semiconductor components may be joined to the cover body of the cooling apparatus by pressurizing and an elastic material may be inserted between the joint area in the semiconductor components and the cover body.

A thickness of the elastic material may be changed before and after pressurizing of the semiconductor components.

The substrate may include at least one insulation layer.

One side and the other side of the substrate may include a metal pattern.

The substrate may be formed in a stack structure including at least one metal layer, the insulation layer formed on the metal layer, and at least one metal layer formed on the insulation layer.

A solder or a layer containing Ag or Cu may be interposed between the semiconductor chip and the substrate.

The semiconductor chip may be an Insulated Gate Bipolar Transistor (IGBT) or a Metal-Oxide-Semiconductor Field-Effect Transistor (MOSFET).

The at least one opening member of the cover body may be joined to one surface or both surfaces of the semiconductor components.

The semiconductor chip may be electrically connected to the substrate by line-joining using a metal wire or by surface-joining using a metal plate.

The substrate may include a lower substrate where the semiconductor chips are installed, and an upper substrate spaced apart from the lower substrate. The semiconductor chip may be electrically connected to the upper substrate by surface-joining using the metal plate.

A conductive adhesive may be filled between the semiconductor chip and the metal plate.

The cover body of the cooling apparatus may be formed of a non-conductive material.

The other side of the substrate and the cover body of the cooling apparatus may be formed of a single material including Al or an alloy containing 50% or more of Al and may be structurally bonded to each other by welding.

The system may be used in a power conversion device for an inverter, a converter, or an On Board Charger (OBC).

The cover body may include at least one upper cover and at least one lower cover which face each other and are joined to each other, and the upper cover may contact the substrate and include at least one opening member on the upper cover.

The distances at one ends between the adjacent cooling posts may be formed to be shorter than the distances at the other ends.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
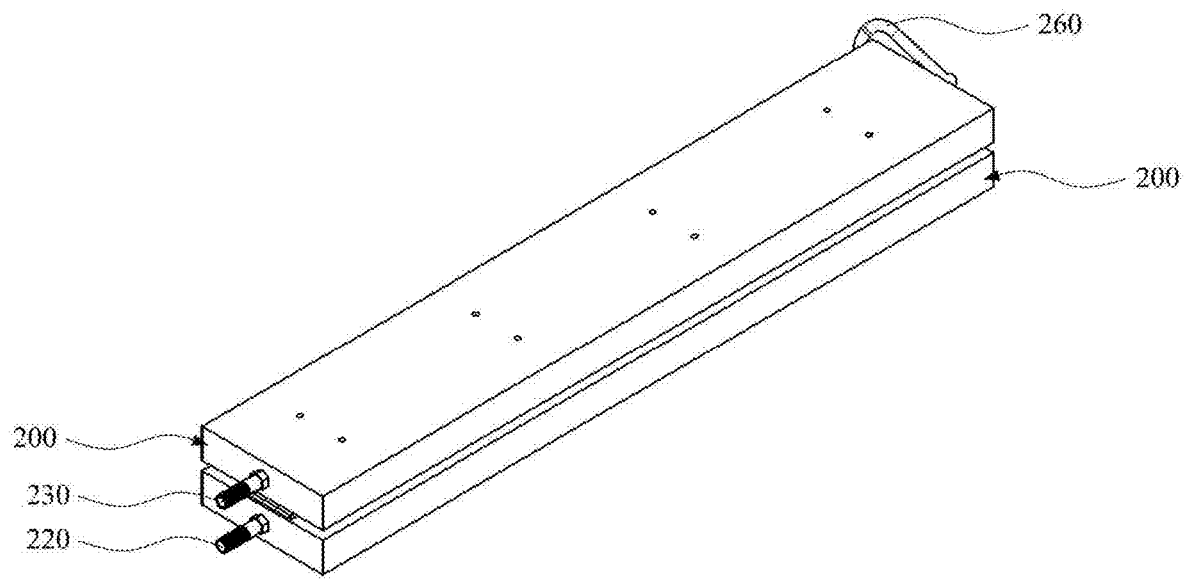
FIGS. 1A and 1B are perspective views of a cooling system where a semiconductor component including a semiconductor chip and a cooling apparatus are joined, according to an embodiment of the present invention.
Figure 1B:
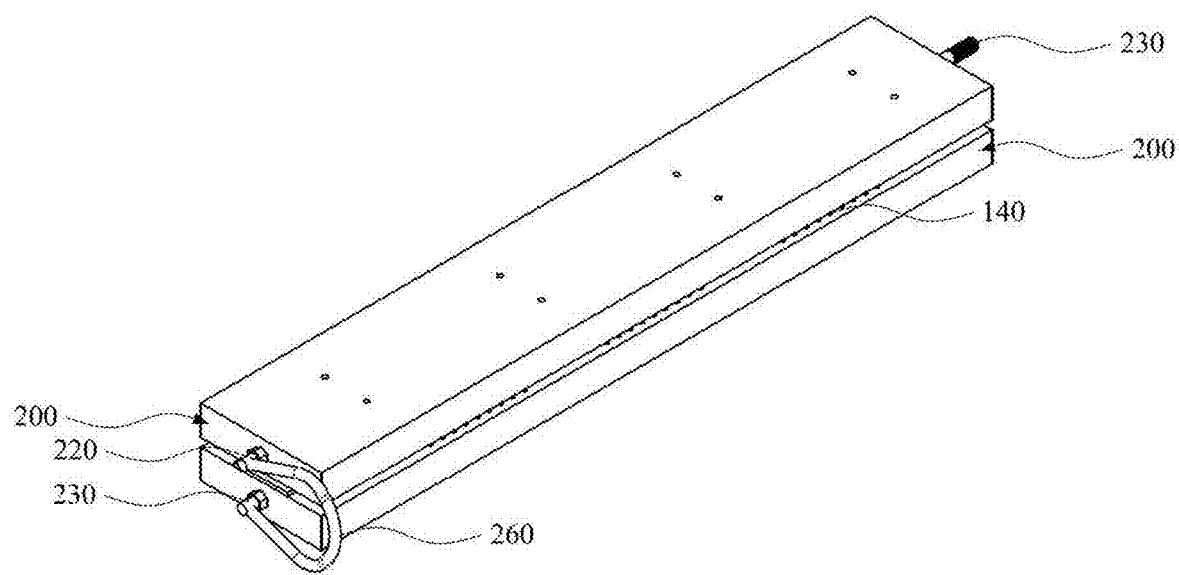
Figure 2:
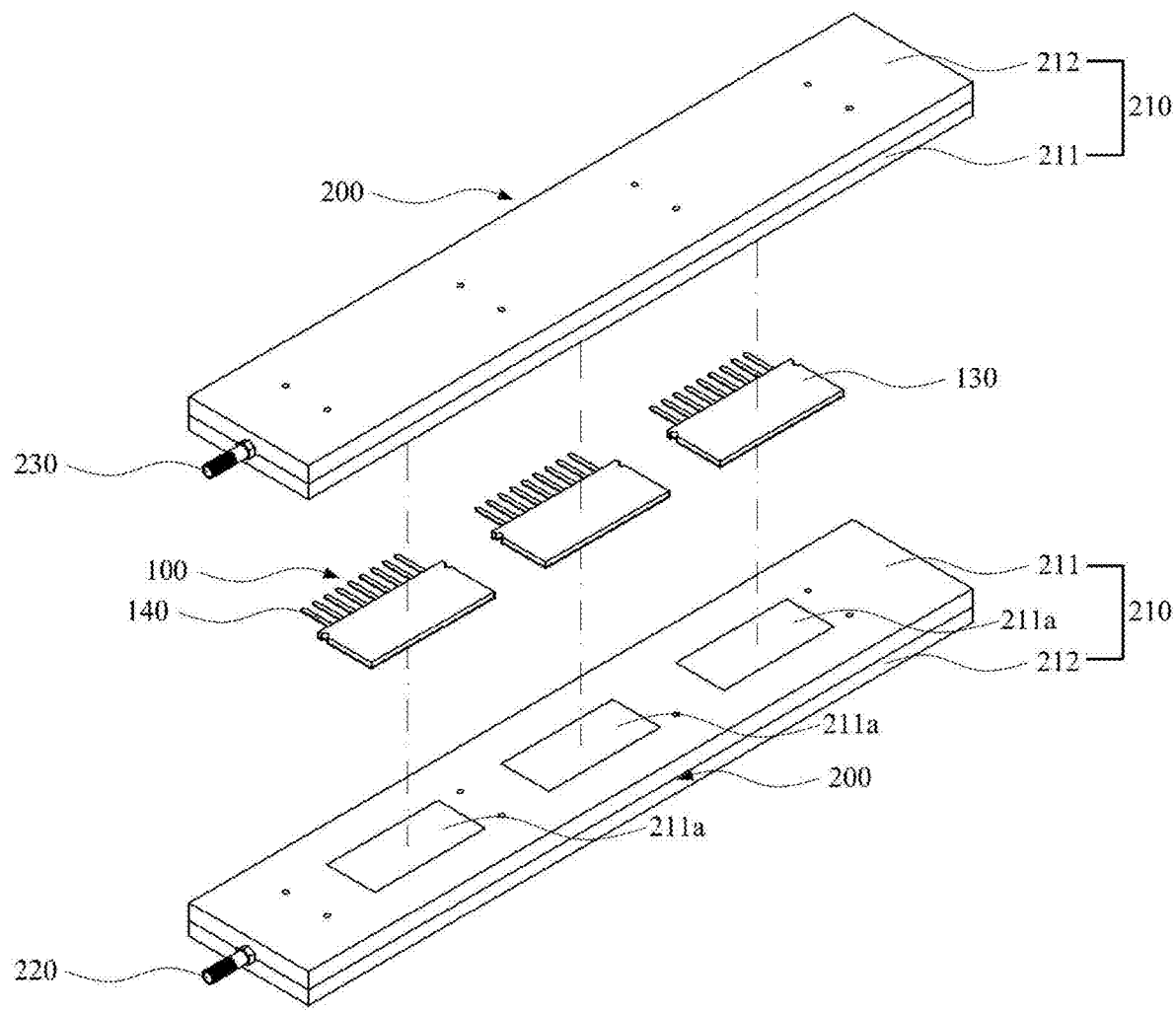
FIG. 2 is an exploded perspective view of the cooling system of FIGS. 1A and 1B where a semiconductor component including a semiconductor chip and a cooling apparatus are joined.
Figure 3A:
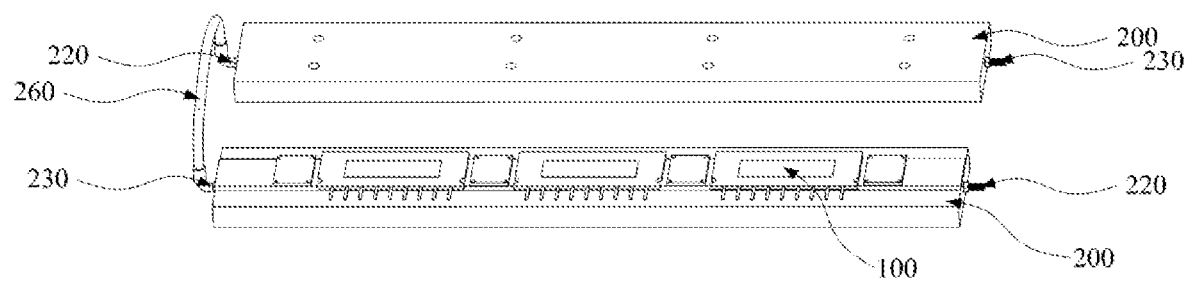
FIGS. 3A and 3B illustrate photographs of a product where the cooling system of FIGS. 1A and 1B, where a semiconductor component including a semiconductor chip and a cooling apparatus are joined, is applied.
Figure 3B:
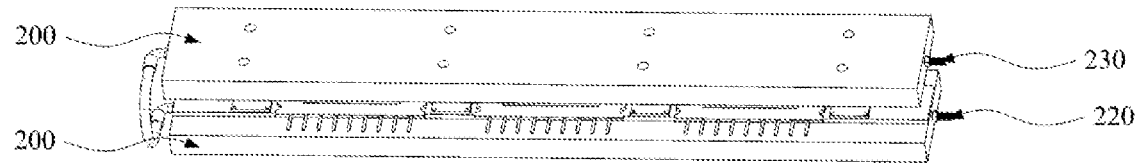

Hereinafter, the present invention will be described in more detail with reference to the accompanying drawings.

A cooling system where a semiconductor component including a semiconductor chip and a cooling apparatus are joined, according to an embodiment of the present invention includes semiconductor components 100 and a cooling apparatus 200. The semiconductor components 100 includes at least one substrate 120, where at least one semiconductor chip 110 is installed on one side thereof, a package housing 130 covering the substrates 120, and at least one terminal lead 140 electrically connected to the semiconductor chips 110 and exposed to the outside of the package housing 130, wherein the other sides of the substrates 120 are partly or entirely exposed to the upper surface, the lower surface, or the upper and lower surfaces of the package housing 130. The cooling apparatus 200 includes a cover body 210 and at least one cooling post 240, wherein the cover body 210 includes a coolant flow path P in an inner space thereof and at least one opening member 211a on one side thereof where the substrate 120 contacts, and the at least one cooling post 240 is arranged vertically across the inner space of the cover body 210 and is formed of a conductive or non-conductive material. The cooling apparatus 200 further includes at least one inlet 220, where a coolant flows in, and at least one outlet 230, from where a coolant is discharged. Areas of the upper surfaces or the lower surfaces of the semiconductor components 100 are larger than areas of the opening members 211a and at least one length L1 of the substrates 120 exposed to the surface of the package housing 130 is shorter than at least one length L2 of the opening members 211a. Here, heat generated and transmitted from the semiconductor chip 110 to the substrates 120, which are exposed through the opening members 211a, and the cooling posts 240 is directly cooled by a coolant.

In addition, a cooling system where a semiconductor component including a semiconductor chip and a cooling apparatus are joined, according to another embodiment of the present invention includes the semiconductor components 100 and the cooling apparatus 200. The semiconductor components 100 includes the at least one substrate 120, where the at least one semiconductor chip 110 is installed on one side thereof, the package housing 130 covering the substrates 120, and the at least one terminal lead 140 electrically connected to the semiconductor chips 110 and exposed to the outside of the package housing 130, wherein the other sides of the substrates 120 are partly or entirely exposed to the upper surface, the lower surface, or the upper and lower surfaces of the package housing 130. The cooling apparatus 200 includes the cover body 210 and the at least one cooling post 240, wherein the cover body 210 includes the coolant flow path P in an inner space thereof and the at least one opening member 211a on one side thereof where the substrate 120 contacts, and the at least one cooling post 240 is arranged vertically across the inner space of the cover body 210 and is formed of a conductive or non-conductive material. The cooling apparatus 200 further includes the at least one inlet 220, where a coolant flows in, and the at least one outlet 230, from where a coolant is discharged. Areas of the upper surfaces or the lower surfaces of the semiconductor components 100 are larger than areas of the opening members 211a and the at least one length L1 of the substrates 120 exposed to the surface of the package housing 130 is longer than the at least one length L2 of the opening members 211a. Here, heat generated and transmitted from the semiconductor chip 110 to the substrates 120, which are exposed through the opening members 211a, and the cooling posts 240 is directly cooled by a coolant.

Here, in the cooling system where the semiconductor component including the semiconductor chip and the cooling apparatus are joined according to an embodiment of the present invention, the substrate 120 exposed to the surface of the package housing 130 covers the opening members 211a of the cover body 210, more specifically, a part of the opening members 211a on an upper cover 211, and the semiconductor component 100 is joined to the cooling apparatus 200. In the cooling system where the semiconductor component including the semiconductor chip and the cooling apparatus are joined according to another embodiment of the present invention, the substrate 120 exposed to the surface of the package housing 130 covers the opening members 211a of the cover body 210, more specifically, the entire opening members 211a of the upper cover 211, and the semiconductor component 100 is joined to the cooling apparatus 200.

Hereinafter, the cooling system where the semiconductor component including the semiconductor chip and the cooling apparatus are joined according to an embodiment of the present invention will be described in more detail below.

Firstly, the semiconductor component 100 is a semiconductor package including the semiconductor chip 110, wherein the semiconductor chip 110 may be a power converting semiconductor chip. According to an embodiment of the present invention, the semiconductor chip 110 may be an Insulated Gate Bipolar Transistor (IGBT) or a Metal-Oxide-Semiconductor Field-Effect Transistor (MOSFET). However, the present invention is not limited thereto.

Such a semiconductor component 100 including the semiconductor chip 110 may be a device including an inverter for converting or controlling power, a converter, or an On Board Charger (OBC). In converting electric power into specific current, specific voltage, or specific frequency, excessive heat is generated and thereby, cooling may be performed using the cooling apparatus 200.

As illustrated in FIGS. 1A through 3B, in the cooling system where the semiconductor component including the semiconductor chip and the cooling apparatus are joined according to the embodiment of the present invention, the cooling apparatus 200 is joined to one side or both sides of the semiconductor components 100 so as for a coolant to directly contact the at least one substrate 120 exposed to the outside of the 130 in the semiconductor components 100 through the opening members 211a and thereby, efficiencies of heat conductivity and heat radiation may be improved.

Figure 4A:
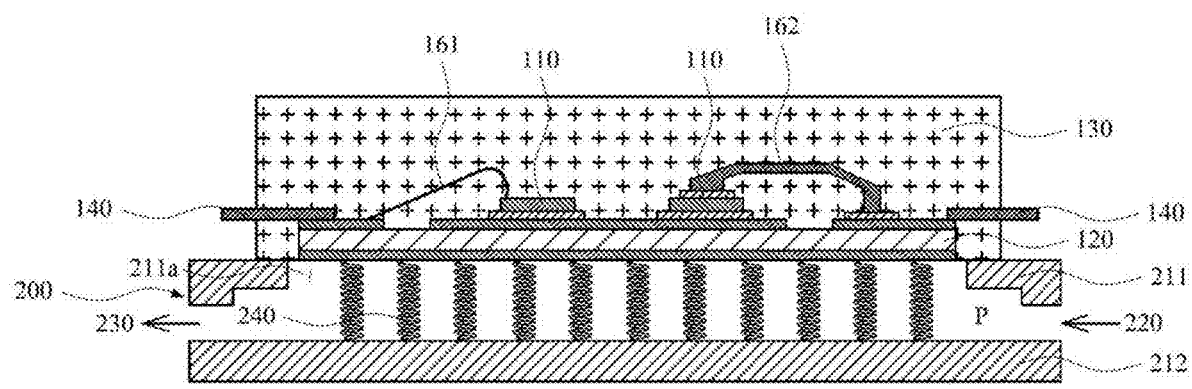
FIGS. 4A through 6 are cross-sectional views illustrating a first example of a cooling post in the cooling system of FIGS. 1A and 1B where a semiconductor component including a semiconductor chip and a cooling apparatus are joined according to an embodiment of the present invention.
Figure 4B:
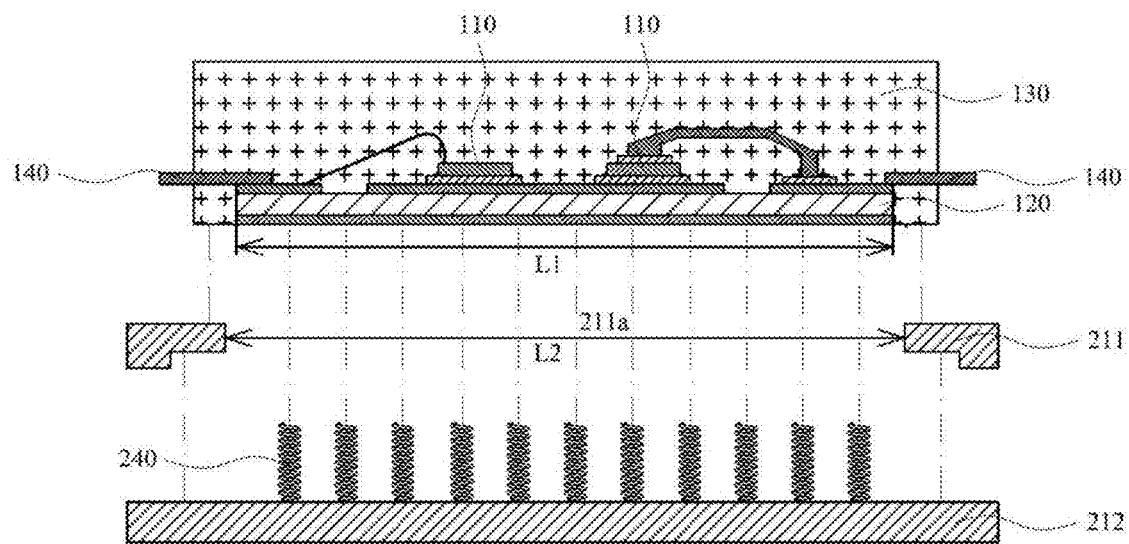
Figure 5:
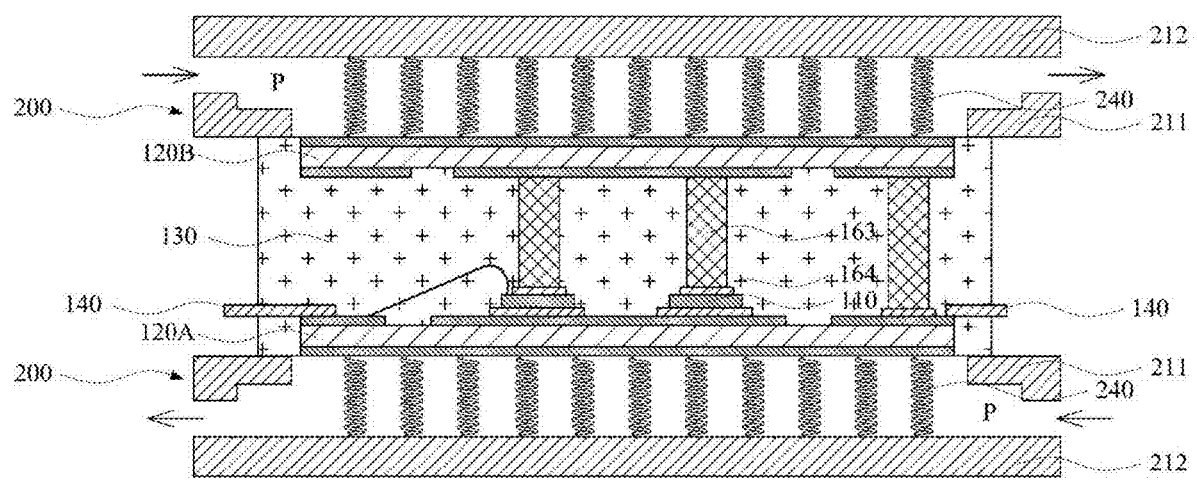

More specifically, as illustrated in FIGS. 4A, 4B and 5, the semiconductor component 100 includes the at least one substrate 120, where the at least one semiconductor chip 110 is installed on one side thereof, the package housing 130 covering the semiconductor chips 110 and the substrates 120, and the at least one terminal lead 140 electrically connected to the semiconductor chips 110 and exposed to the outside of the package housing 130, wherein at least the other sides of the substrates 120 are partly exposed to the upper surface, the lower surface (refer to FIGS. 4A and 4B), or the upper and lower surfaces (refer to FIG. 5) of the package housing 130 so as to directly contact a coolant passing through the cooling apparatus 200.

That is, the substrates 120 may be exposed to one surface or both surfaces of the package housing 130 depending on a one-sided substrate structure or a both-sided structure. The at least one opening member 211a of the cover body 210, more specifically, the at least one opening members 211a of the upper cover 211 may be bonded to one surface or both surfaces of the package housing 130

Here, FIGS. 4A and 4B illustrate one-sided bond between the semiconductor components 100 formed of a one-sided substrate, and the cooling apparatus 200 and FIG. 5 illustrates both-sided bond between the semiconductor components 100 formed of a both-sided substrate, and the cooling apparatus 200. However, the present invention is not limited thereto, and the both-sided bond may be performed between the semiconductor components 100 formed of a one-sided substrate, and the cooling apparatus 200.

Figure 6:
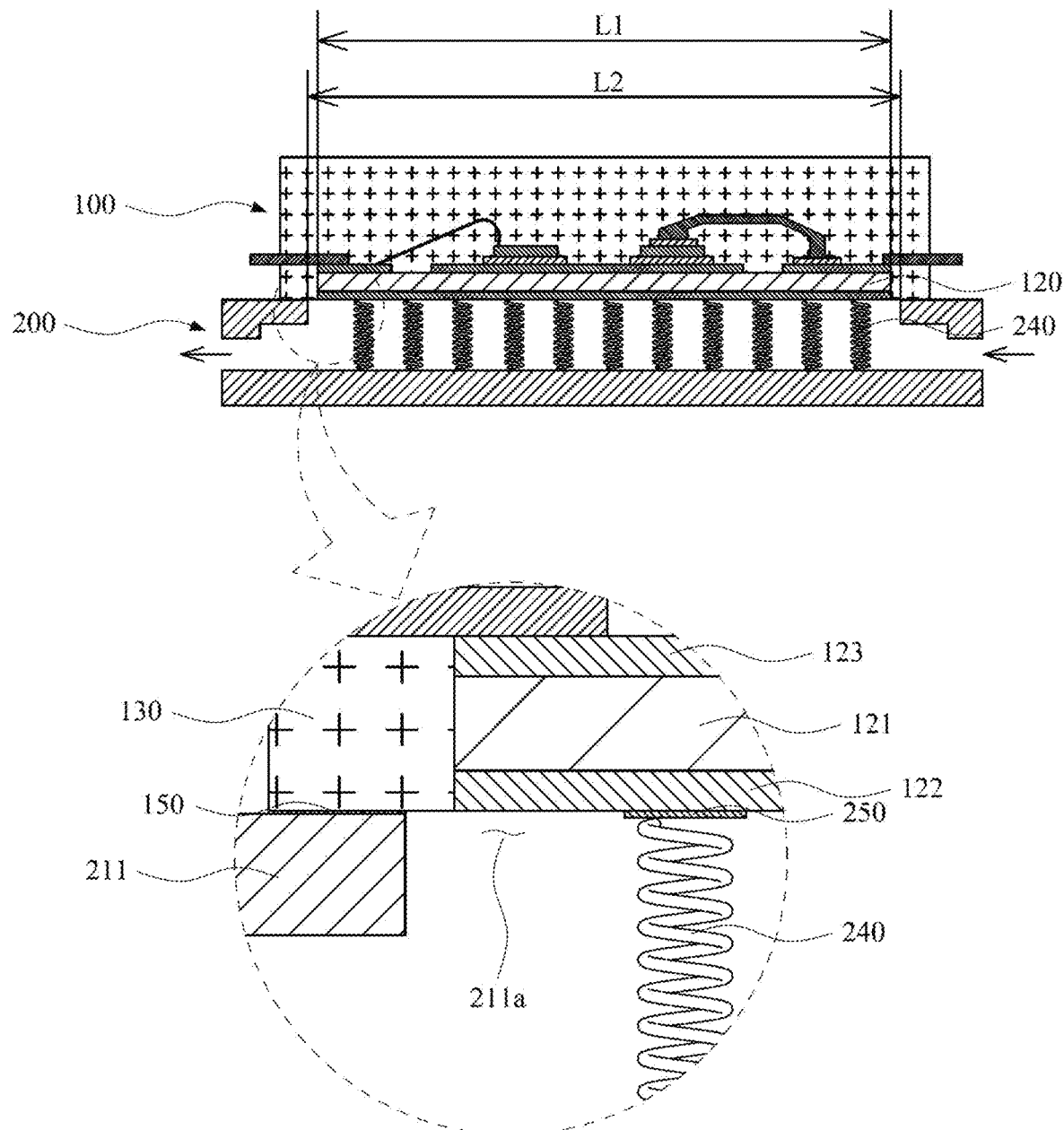
Figure 7:
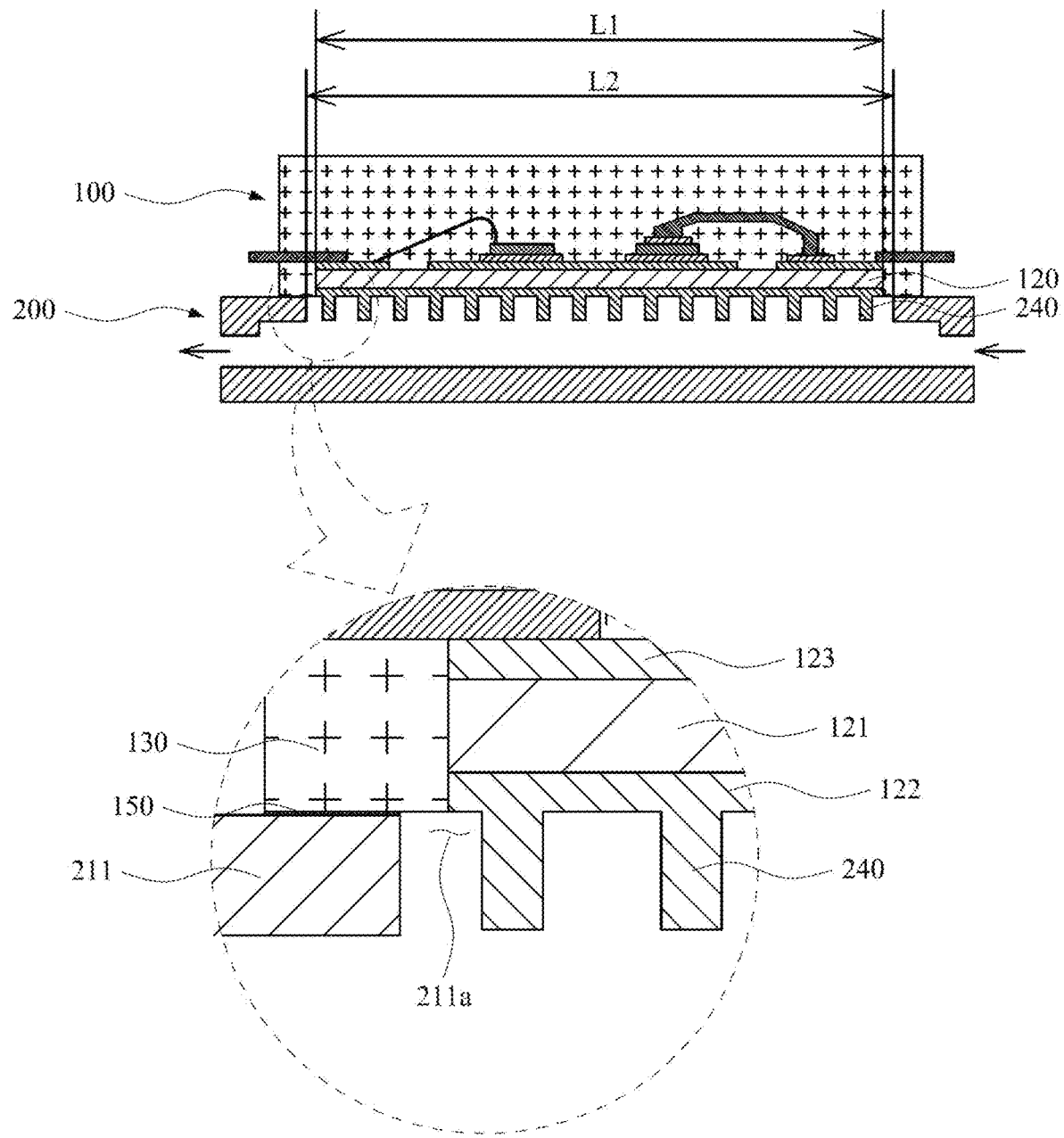
FIG. 7 is a cross-sectional view illustrating a second example of a cooling post in the cooling system of FIGS. 1A and 1B where a semiconductor component including a semiconductor chip and a cooling apparatus are joined according to an embodiment of the present invention.

Also, as illustrated in enlarged views of FIGS. 6 and 7, the substrate 120 may include at least one insulation layer 121 and a metal pattern may be formed on one side and/or the other side of the substrate 120.

In addition, the substrate 120 may be formed in a stack structure including at least one metal layer 122, the insulation layer 121 formed on the metal layer 122, and at least one metal layer 123 formed on the insulation layer 121.

Although not illustrated, a solder or a layer containing Ag or Cu may be interposed between the semiconductor chip 110 and the substrate 120 so that electrical connection and electrical conductivity may be increased.

Referring to FIGS. 4A and 4B, the semiconductor chip 110 may be electrically connected to a metal pattern of the substrate 120 by line-joining (or spot-joining) using a metal wire 161 or by surface-joining using a metal clip (a metal plate) 162.

Referring to FIG. 5, the substrate 120 includes a lower substrate 120A where the semiconductor chips 110 are installed, and an upper substrate 120B spaced apart from the lower substrate 120A. The semiconductor chip 110 may be electrically connected to the upper substrate 120B by surface-joining using a metal post (a metal plate) 163 and a conductive adhesive 164 may be filled between the semiconductor chip 110 and the metal post (a metal plate) 163.

Next, the cooling apparatus 200 is joined to one surface or both surfaces of the semiconductor component 100 and supplies a coolant through the coolant flow path P so that the substrate 120 exposed from the package housing 130 directly contacts the coolant and is cooled.

More specifically, as illustrated in FIGS. 2, 4A, 4B, and 5, the cooling apparatuses 200 face each other, are joined to each other, and are gas-tighten or water-tighten and are separated into the at least one upper cover 211 including the coolant flow path P in the inner space thereof, and the at least one lower cover 212. The upper cover 211 contacting the substrate 120 exposed from the package housing 130 includes the cover body 210, the inlet 220, the outlet 230, and the at least one cooling post 240, wherein the cover body 210 includes the at least one opening members 211a formed thereon, the inlet 220, where a coolant flows in, is joined to one side of the cover body 210, the outlet 230, where a coolant is discharged, is joined to the other side of the cover body 210, and the at least one cooling post 240 is arranged vertically across the inner space of the cover body 210 and is formed of a conductive or non-conductive material. Accordingly, heat from the semiconductor components 100 may be efficiently radiated by a coolant directly contacting the substrate 120 and the cooling post 240.

Here, the cover body 210 of the cooling apparatus 200, more preferably, the upper cover 211 may be formed of a non-conductive material. The other side of the substrate 120 and the cover body 210 of the cooling apparatus 200, more preferably, the upper cover 211, may be formed of a single material including Al or an alloy containing 50% or more of Al and may be structurally bonded to each other by welding without using an adhesive.

For reference, referring to FIGS. 1A through 3B, when the cooling apparatuses 200 are each joined to both sides of the semiconductor components 100, a coolant may circulate from the cooling apparatus 200 joined to one surface of the semiconductor components 100 to the cooling apparatus 200 joined to the other surface of the semiconductor components 100 through a circulating pipe 260 which connects each coolant flow path P.

Also, the cooling posts 240 are vertically arranged in the inner space of the cover body 210 and at least one, more preferably, a plurality of cooling posts 240 may be vertically arranged in the flowing direction of a coolant.

As mentioned above, according to an embodiment of the present invention, areas of the upper surfaces or the lower surfaces of the semiconductor components 100 are formed to be larger than areas of the opening members 211a so that the semiconductor components 100 completely cover the opening members 211a so as to be gas-tighten or water-tighten. Also, as illustrated in FIGS. 6 and 7, the at least one length L1 of the substrates 120 exposed to the surface of the package housing 130 is shorter than the at least one length L2 of the opening members 211a. Heat generated and transmitted from the semiconductor chip 110 to the substrates 120, which are exposed through the opening members 211a, and the cooling posts 240 is directly cooled by a coolant.

Figure 8A:
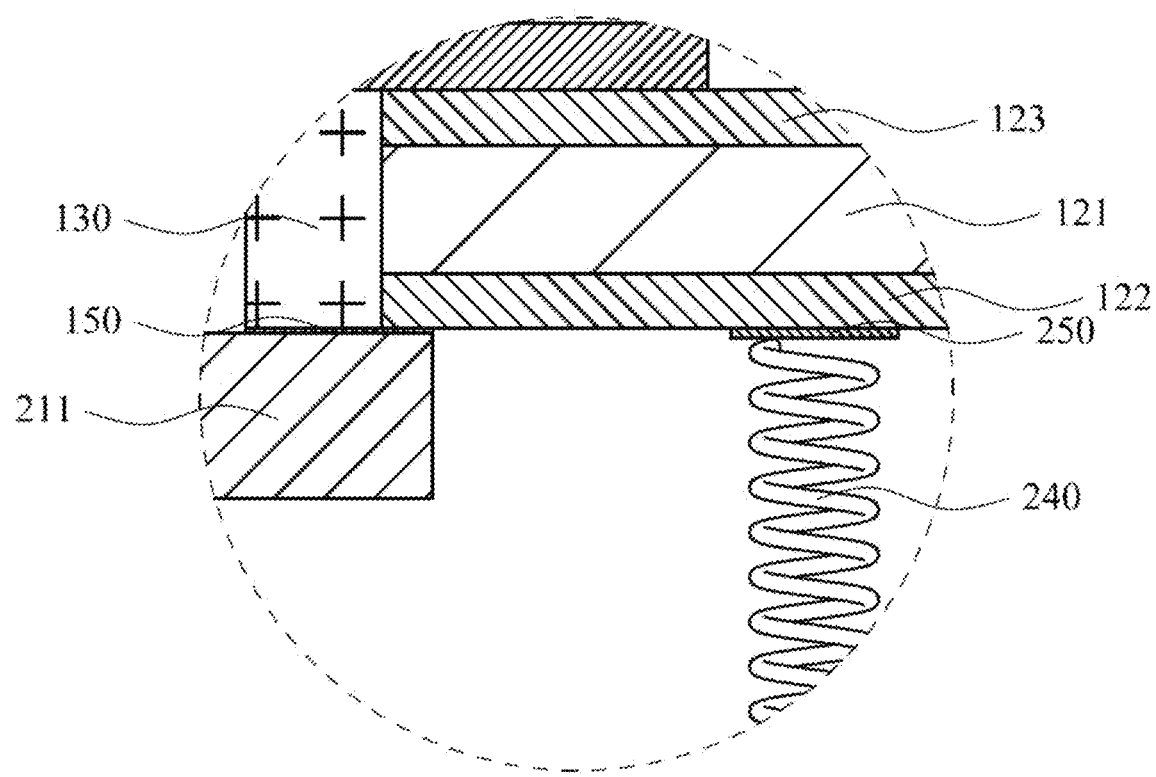
FIGS. 8A and 8B are cross-sectional views respectively illustrating the cooling system of FIGS. 1A and 1B where a semiconductor component including a semiconductor chip and a cooling apparatus are joined according to another embodiment of the present invention.
Figure 8B:
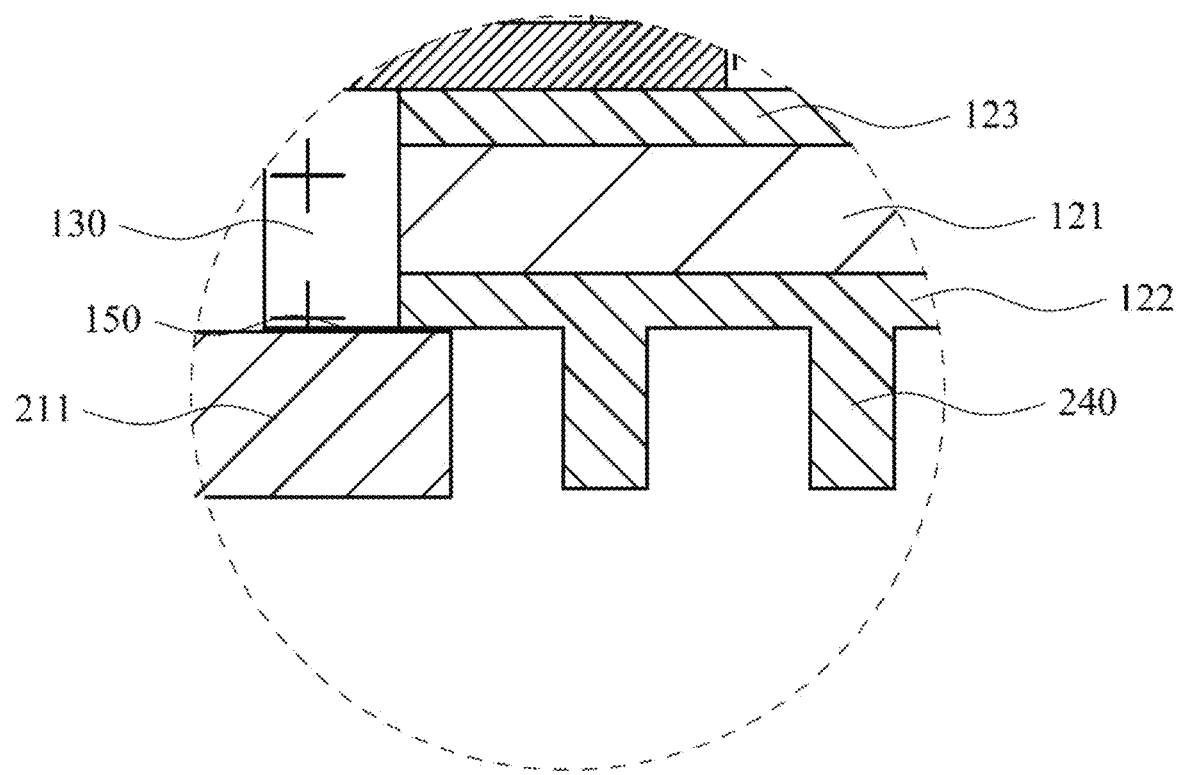

In addition, according to another embodiment of the present invention, areas of the upper surfaces or the lower surfaces of the semiconductor components 100 are formed to be larger than areas of the opening members 211a so that the semiconductor components 100 completely cover the opening members 211a so as to be gas-tighten or water-tighten. Also, as illustrated in FIGS. 8A and 8B, the at least one length L1 of the substrates 120 exposed to the surface of the package housing 130 is longer than the at least one length L2 of the opening members 211a. Heat generated and transmitted from the semiconductor chip 110 to the substrates 120, which are exposed through the opening members 211a, and the cooling posts 240 is directly cooled by a coolant.

Here, referring to FIGS. 4A, 4B and 5, the at least one terminal lead 140 included in the package housing 130 is joined to one surface of the substrate 120. The joined terminal leads 140 and the cover body 210 of the cooling apparatus 200 (more preferably, the upper cover 211) face each other in a horizontal direction. Accordingly, an area between the terminal leads 140 and the cover body 210 (more preferably, the upper cover 211) is expanded to the maximum, and heat generated and transmitted from the substrates 120 to the terminal leads 140 may be indirectly cooled by the cooling apparatus 200.

As illustrated in FIGS. 6 through 8B, one surface of the semiconductor components 100, that is, a lower surface of the package housing 130 or the other side of the substrate 120, is joined to the upper cover 211, where the opening members 211a of the cooling apparatus 200 are formed, by using a conductive adhesive 150 or a non-conductive adhesive 150 and then, is water-tighten so as for a coolant to not flow outside of the upper cover 211.

For example, as in an embodiment, when each length L1 of the substrates 120 exposed to the surface of the package housing 130 is shorter than each length L2 of the opening members 211a, the conductive adhesive 150 or the non-conductive adhesive 150 is interposed between the lower surface of the package housing 130 and the upper cover 211 (refer to FIGS. 6 and 7). As in another embodiment, when each length L1 of the substrates 120 exposed to the surface of the package housing 130 is longer than each length L2 of the opening members 211a, the conductive adhesive 150 or the non-conductive adhesive 150 may be interposed between the lower surface of the package housing 130, the other side of the substrate 120 and the upper cover 211 (refer to FIGS. 8A and 8B).

Although not illustrated, without using the conductive adhesive 150 or the non-conductive adhesive 150, the lower surfaces of the semiconductor components 100 are joined to the upper cover 211 of the cooling apparatus 200 by pressurizing, and an elastic material is inserted between the joint area in the semiconductor components 100 and the upper cover 211. A thickness of the elastic material changes (a thickness of the elastic material is changed to be greater in depressurizing compared with the thickness in pressurizing) before and after pressurizing of the semiconductor components 100 and the cooling apparatus 200 and thereby, the semiconductor components 100 is water-tighten so as for a coolant to not flow outside of the upper cover 211 by the compressed elastic material.

Also, referring to FIG. 7, the cooling posts 240 are formed to penetrate the opening members 211a and to project from the other side of the substrate 120 and thereby, may be formed to directly contact a coolant.

Here, the cooling posts 240 may be formed of a material that is same as that of the other side of the substrate 120 or may be formed of a material that is different from that of the other side of the substrate 120.

Also, the cooling posts 240 may be formed of a conductive or a non-conductive material. More specifically, the cooling posts 240 may be formed of a single material including Cu or Al or an alloy containing 50% or more of Cu or Al. In addition, the cooling posts 240 may be formed of a ceramic material, however, the present invention is not limited thereto. Although not illustrated, a vertical axis structure of the cooling posts 240 may have various forms such as a linear structure, a nonlinear structure, or a structure including penetration holes where a coolant penetrates, and a horizontal axis structure of the cooling posts 240 may be in a form of a quadrangle, a circle, or an ellipse.

Referring to FIG. 6, the cooling posts 240 may be formed in a spring structure having an elastic force so that an area contacting a coolant enlarges and thereby, heat radiation may be efficiently performed. Here, the cooling posts 240 having a spring structure may include square coils, circular coils, or elliptical coils.

Also, the cooling posts 240 projected from the substrate 120 or formed in a spring structure may be stably joined to the other side of the substrate 120 by using a conductive adhesive 250 or a non-conductive adhesive 250.

Figure 9A:
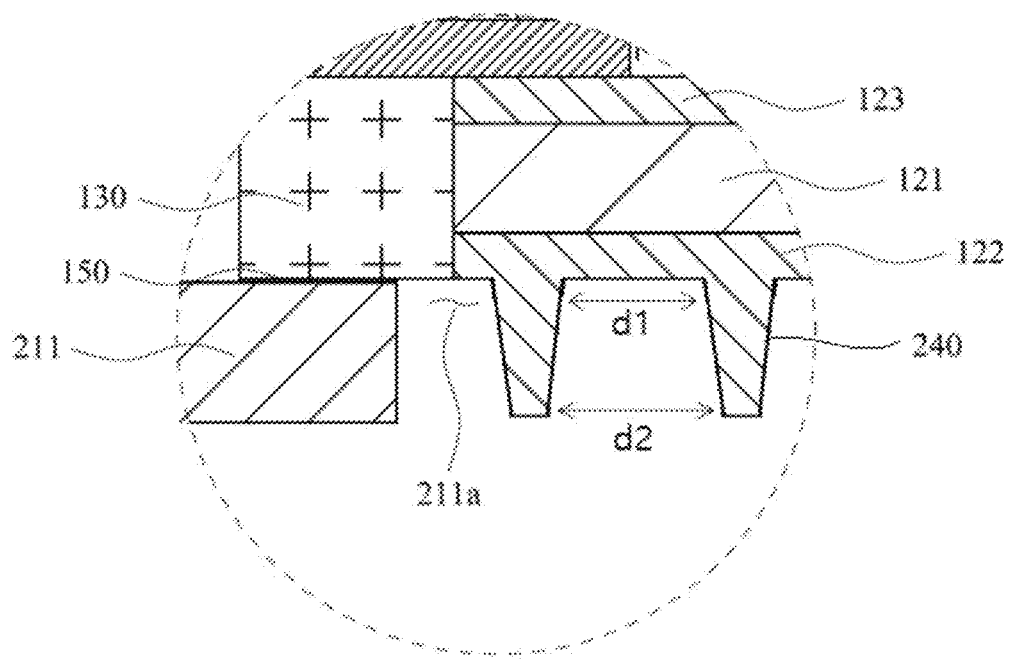
FIGS. 9A and 9B are cross-sectional views respectively illustrating the cooling system of FIGS. 1A and 1B where a semiconductor component including a semiconductor chip and a cooling apparatus are joined according to another embodiment of the present invention.
Figure 9B:
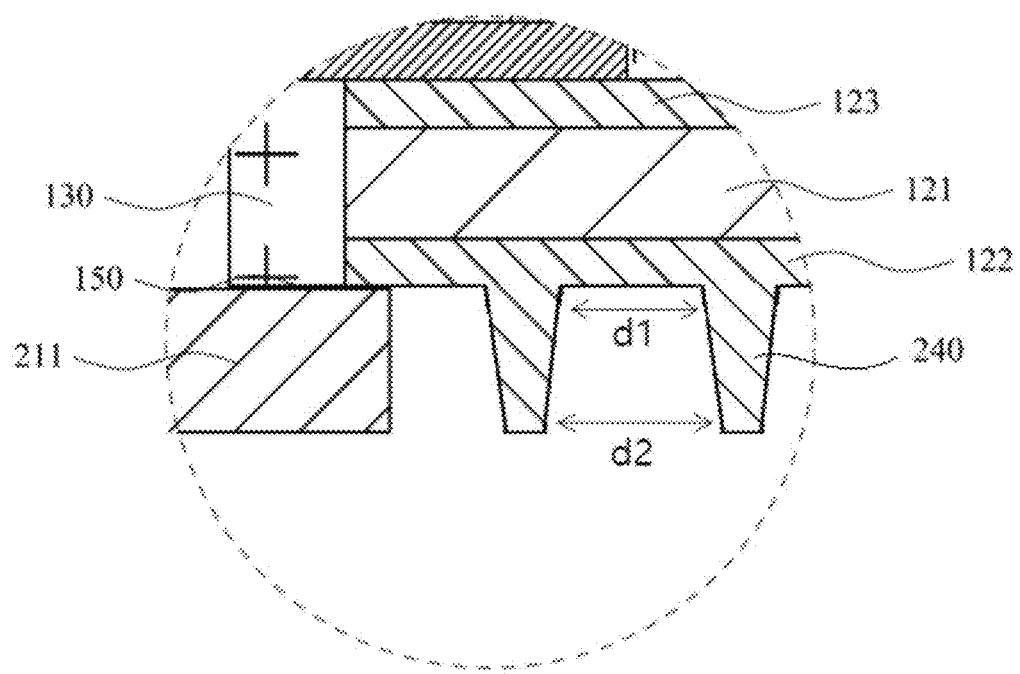

Referring to FIGS. 9A and 9B, distances d1 at one ends between the adjacent cooling posts 240 and distances d2 at the other ends between the adjacent cooling posts 240 may be different from each other, and more preferably, d1 may be shorter than d2. In this regard, a coolant may smoothly flow and thereby, cooling efficiency may be improved.

More specifically, the internal diameters at one ends of the cooling posts 240 projected from the substrate 120 are formed to be greater than the internal diameters at the other ends of the cooling posts 240, or the internal diameters at one ends of the cooling posts 240 having a spring structure are formed to be greater than the internal diameters at the other ends of the cooling posts 240. Accordingly, the distances d1 at one ends between the adjacent cooling posts 240 may be formed to be shorter than the distances d2 at the other ends. In this regard, a coolant circulating the other ends (lower parts) of the cooling posts 240 may smoothly flow and thus, heat transmitted from the semiconductor components 100 to the other ends of the cooling posts 240 may be efficiently cooled.

Also, the length of the cooling posts 240 after the semiconductor components 100 are joined to the cooling apparatus 200 is formed to be shorter than the length of the cooling posts 240 before the semiconductor components 100 are joined to the cooling apparatus 200. In particular, even if a coolant circulates, the cooling posts 240 may be stably fixed between the upper cover 211 and the lower cover 212 by compressive stress of the cooling posts 240 having a spring structure after the semiconductor components 100 are joined to the cooling apparatus 200.

In addition, the inlet 220 and the outlet 230 may be separately formed in a single structure and may be gas-tighten or water-tighten while the upper cover 211 and the lower cover 212 are joined to each other. Also, the inlet 220 and the outlet 230 may be formed as one body with the upper cover 211 and the lower cover 212 and may be gas-tighten or water-tighten while the upper cover 211 and the lower cover 212 are joined to each other.

As mentioned above, the inlet 220 and the outlet 230 are respectively formed at one end and the other end of the cover body 210. However, the present invention is not limited thereto and the inlet 220 and the outlet 230 may be formed to be spaced apart from each other at the same side of the cover body 210.

Moreover, a coolant may be selectively a coolant fluid, refrigerant gas, or air (cold air) according to the standard of the semiconductor chip 110 or a material and a form of the cover body 210.

Accordingly, in the cooling system where the semiconductor component including the semiconductor chip and the cooling apparatus are joined, the coolant is supplied to the substrate, on which the semiconductor chip is installed, through the opening member of the cooling apparatus so that a surface of the substrate may be directly cooled by the coolant so as to improve cooling efficiency, and a cooling post structure, which enables the coolant to smoothly flow, is used to further improve cooling efficiency. Also, regardless of a substrate structure, the cooling apparatus is joined to one surface or both surfaces of the semiconductor component so as to radiate heat and the cooling posts joined to the substrate are vertically arranged in the coolant flow path so as to enlarge an area contacting the coolant. Therefore, efficiency of heat radiation may be improved.

According to the present invention, the coolant is supplied to the substrate, on which the semiconductor chip is installed, through the opening member of the cooling apparatus so that a surface of the substrate may be directly cooled by the coolant so as to improve cooling efficiency, and a cooling post structure, which enables the coolant to smoothly flow, is used to further improve cooling efficiency. Also, regardless of a substrate structure, the cooling apparatus is joined to one surface or both surfaces of the semiconductor component so as to radiate heat and the cooling posts joined to the substrate are vertically arranged in the coolant flow path so as to enlarge an area contacting the coolant. Therefore, efficiency of heat radiation may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A cooling system where a semiconductor component comprising a semiconductor chip and a cooling apparatus are joined, the system comprising:

a semiconductor component comprising at least one substrate, where at least one semiconductor chip is installed on one side thereof, a package housing covering the at least one substrate, and at least one terminal lead electrically connected to the at least one semiconductor chip and exposed to the outside of the package housing, wherein the other side of the at least one substrate is partly or entirely exposed to an upper surface, a lower surface, or the upper and lower surfaces of the package housing; and a cooling apparatus comprising a cover body and at least one cooling post, wherein the cover body comprises a coolant flow path in an inner space thereof and at least one opening member on one side thereof where the at least one substrate contacts, and the at least one cooling post is arranged vertically across the inner space of the cover body and is formed of a conductive or non-conductive material, wherein the cooling apparatus further comprises at least one inlet, where a coolant flows in, and at least one outlet, from where a coolant is discharged, a length of the at least one substrate exposed to the surface of the package housing is shorter than a length of the at least one opening member, and heat generated and transmitted from the semiconductor chip to the at least one substrate, which is exposed through the at least one opening member, and the at least one cooling post is directly cooled by a coolant.

2. A cooling system where a semiconductor component comprising a semiconductor chip and a cooling apparatus are joined, the system comprising:

a semiconductor component comprising at least one substrate, where at least one semiconductor chip is installed on one side thereof, a package housing covering the at least one substrate, and at least one terminal lead electrically connected to the at least one semiconductor chips and exposed to the outside of the package housing, wherein the other side of the at least one substrate is partly or entirely exposed to an upper surface, a lower surface, or the upper and lower surfaces of the package housing; and a cooling apparatus comprising a cover body and at least one cooling post, wherein the cover body comprises a coolant flow path in an inner space thereof and at least one opening member on one side thereof where the at least one substrate contacts, and the at least one cooling post is arranged vertically across the inner space of the cover body and is formed of a conductive or non-conductive material, wherein the cooling apparatus further comprises at least one inlet, where a coolant flows in, and at least one outlet, from where a coolant is discharged, a length of the at least one substrate exposed to the surface of the package housing is longer than a length of the at least one opening member, and heat generated and transmitted from the semiconductor chip to the at least one substrate, which is exposed through the at least one opening member, and the at least one cooling post is directly cooled by a coolant, wherein the at least one cooling post comprises a plurality of cooling posts, and a distance between proximal ends of adjacent cooling posts and a distance between distal ends of the adjacent cooling posts are different from each other.

3. The cooling system of claim 2, wherein the package housing of the semiconductor component or the other side of the substrate is joined to the cover body of the cooling apparatus by using a conductive adhesive or a non-conductive adhesive.

4. The cooling system of claim 2, wherein the cooling posts are projected from the other side of the substrate.

5. The cooling system of claim 2, wherein the cooling posts are formed in a spring structure having an elastic force.

6. The cooling system of claim 2, wherein the cooling posts are joined to the other side of the substrate by using a conductive adhesive or a non-conductive adhesive.

7. The cooling system of claim 2, wherein a length of the cooling posts after the semiconductor component is joined to the cooling apparatus is shorter than a length of the cooling posts before the semiconductor component is joined to the cooling apparatus.

8. The cooling system of claim 2, wherein the lower surface of the semiconductor component is joined to the cover body of the cooling apparatus by pressurizing and an elastic material is inserted between the joint area in the semiconductor component and the cover body.

9. The cooling system of claim 2, wherein the substrate comprises at least one insulation layer.

10. The cooling system of claim 2, wherein one side and the other side of the substrate comprises a metal pattern.

11. The cooling system of claim 2, wherein the substrate is formed in a stack structure comprising at least one metal layer, and insulation layer formed on the metal layer, and at least one metal layer formed on the insulation layer.

12. The cooling system of claim 2, wherein a solder or a layer containing Ag or Cu is interposed between the semiconductor chip and the substrate.

13. The cooling system of claim 2, wherein the semiconductor chip is an Insulated Gate Bipolar Transistor (IGBT) or a Metal-Oxide-Semiconductor Field-Effect Transistor (MOSFET).

14. The cooling system of claim 2, wherein the at least one opening member of the cover body is joined to one surface or both surfaces of the semiconductor component.

15. The cooling system of claim 2, wherein the semiconductor chip is electrically connected to the substrate by line-joining using a metal wire or by surface-joining using a metal plate.

16. The cooling system of claim 2, wherein the cover body of the cooling apparatus is formed of a non-conductive material.

17. The cooling system of claim 2, wherein the system is used in a power conversion device for an inverter, a converter, or an On Board Charger (OBC).

18. The cooling system of claim 2, wherein the cover body comprises at least one upper cover and at least one lower cover which face each other and are joined to each other, and the upper cover contacts the substrate and comprises the at least one opening member on the upper cover.

19. The cooling system of claim 2, wherein the at least one terminal lead included in the package housing is joined to one surface of the substrate and the joined terminal lead and the cover body of the cooling apparatus face each other in a horizontal direction.

20. The cooling system of claim 2, wherein the distance between the proximal ends of the adjacent cooling posts is less than the distance between the distal ends of the adjacent cooling posts.

* * * * *